US006786771B2

(12) United States Patent
Gailus

(10) Patent No.: US 6,786,771 B2
(45) Date of Patent: Sep. 7, 2004

(54) INTERCONNECTION SYSTEM WITH IMPROVED HIGH FREQUENCY PERFORMANCE

(75) Inventor: Mark W. Gailus, Somerville, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/325,222

(22) Filed: Dec. 20, 2002

(65) Prior Publication Data

US 2004/0121652 A1 Jun. 24, 2004

(51) Int. Cl.[7] .............................................. H01R 13/648
(52) U.S. Cl. ....................................................... 439/608
(58) Field of Search ................................ 439/608, 620, 439/701

(56) References Cited

U.S. PATENT DOCUMENTS 5,456,619 A * 10/1995 Belopolsky et al. ........ 439/620
5,924,899 A * 7/1999 Paagman .................... 439/701
5,980,321 A * 11/1999 Cohen et al. ............... 439/608
6,102,747 A * 8/2000 Paagman .................... 439/701
6,132,255 A * 10/2000 Verhoeven .................. 439/608
6,174,202 B1 * 1/2001 Mitra ......................... 439/608
6,238,245 B1 * 5/2001 Stokoe et al. ............... 439/608
6,579,116 B2 * 6/2003 Brennan et al. ............ 439/418
6,612,871 B1 * 9/2003 Givens ....................... 439/620

* cited by examiner

*Primary Examiner*—Tulsidas C. Patel
(74) *Attorney, Agent, or Firm*—David H. Hwang; Teradyne Legal Department

(57) ABSTRACT

An interconnection system is described. Absorptive material is selectively positioned throughout the system to improve the high frequency performance of the system. Various embodiments are illustrated, including a backplane-daughtercard connector and a printed circuit board.

11 Claims, 7 Drawing Sheets

INTERCONNECTION SYSTEM WITH IMPROVED HIGH FREQUENCY PERFORMANCE

CROSS-REFERENCES TO RELATED APPLICATIONS

Not Applicable.

STATEMENT REGARDING FEDERALLY SPONSORED RESEARCH OR DEVELOPMENT

Not Applicable.

Reference to Microfiche Appendix

Not Applicable

BACKGROUND OF THE INVENTION

1. Field of the Invention

This invention relates generally to interconnection systems and more specifically to high speed interconnection systems.

2. Description of Related Art

Interconnection systems are used in modern electronic systems to route signals from one electronic component to another. Most modern electronic systems are manufactured from many integrated circuit chips. The chips are mounted to printed circuit boards, which route electric signals between the integrated circuit chips or between the integrated circuit chips and other parts of the system.

Many electronic systems, such as computer servers or telecommunications switches are built using printed circuit boards configured as a backplane and multiple “daughter” cards. In such a configuration, the active circuitry of the electronic system is built on the daughter cards. For example, a processor might be built on one daughter card. A memory bank might be built on a different daughter card. The backplane provides signal paths that route electrical signals between the daughter cards.

Generally, electrical connectors are mounted to both the backplane and the daughter card. These connectors mate to allow electrical signals to pass between the daughter card and the backplane.

Because the electronic systems that use a backplane-daughter card configuration usually process much data, there is a need for the electrical connectors to carry much data. Furthermore, this data is generally transmitted at a high data rate. There is simultaneously a need to make the systems as small as possible. As a result, there is a need to have electrical connectors that can carry many high speed signals in a relatively small space. There is thus a need for high speed-high density connectors.

Several commercially available high-speed, high density electrical connectors are known. For example, U.S. Pat. No. 6,299,483 to Cohen et al. entitled High Speed High Density Electrical Connector is one example. Teradyne, Inc., the assignee of that patent, sells a commercial product called VHDM®. Another example may be found in U.S. Pat. No. 6,409,543 to Astbury, et al. entitled Connector Molding Method and Shielded Waferized Connector Made Therefrom Teradyne, Inc., the assignee of that patent, sells a commercial product called GbX™. The foregoing patents are hereby incorporated by reference.

One of the difficulties that results when a high density, high speed connector is made in this fashion is that the electrical conductors can be so close that there can be electrical interference between adjacent or nearby signal conductors. To reduce interference, and to otherwise provide desirable electrical properties, metal members are often placed between or around adjacent signal conductors. The metal acts as a shield to prevent signals carried on one conductor from creating “cross talk” on another conductor. The metal also impacts the impedance of each conductor, which can further contribute to desirable electrical properties.

The shielding in an interconnection system can never be perfect. Often, the design of the interconnection systems reflects a compromise between the level of shielding that can be achieved and other system requirements. For example, it is often necessary for the interconnection system to have a limited size or to be made in separate pieces that can be disconnected or to be manufactured below a certain cost.

As signal frequencies increase, the risk of crosstalk or other undesirable electrical properties in an interconnection system increases. It would be desirable to provide an improved interconnection system for high frequency signals.

As will be described below, we have invented a system that uses radiation absorptive materials. Use of absorptive material is known in high frequency systems, such as in packages that contain microwave components. However, we do not believe that the prior art has recognized the benefits or application of absorptive material in interconnection as described below.

BRIEF SUMMARY OF THE INVENTION

With the foregoing background in mind, it is an object of the invention to provide an improved interconnection system for high frequency signals.

To achieve the foregoing object, as well as other objectives and advantages, an interconnection system is provided with electromagnetic absorptive members positioned to preferentially absorb unwanted radiation.

In a preferred embodiment, the electromagnetic absorptive members are ferromagnetic materials.

In one embodiment, the interconnection system is a high-speed, high-density electrical connector. In other embodiments, the interconnection system is a printed circuit board.

In another embodiment, material with a high magnetic or electric loss tangent is built into a multi-ground interconnect structure to reduce unwanted modes of electromagnetic energy. Preferred embodiments of the multi-ground interconnect structure are an electrical connector, a circuit board and a cable.

BRIEF DESCRIPTION OF THE DRAWINGS

Additional objects, advantages, and novel features of the invention will become apparent from a consideration of the ensuing description and drawings, in which.

DETAILED DESCRIPTION OF THE PREFERRED EMBODIMENT

In the following description, an interconnection system will first be illustrated by using an electrical connector as an example. Electrical connectors often are the portions of the interconnection system that can most benefit from improvements related to high frequency performance. Often, the design of a connector is constrained by space available in an electronic system. Also, the design is constrained because the parts of the connector must have mechanical properties that allow connectors to be mated and unmated. As a result, the shielding and the size, shape or placement of conductors in a connector often deviates significantly from what would be ideal for high frequency performance. However, other portions of the interconnection system might benefit from design techniques most useful for electrical connectors.

Figure 1:
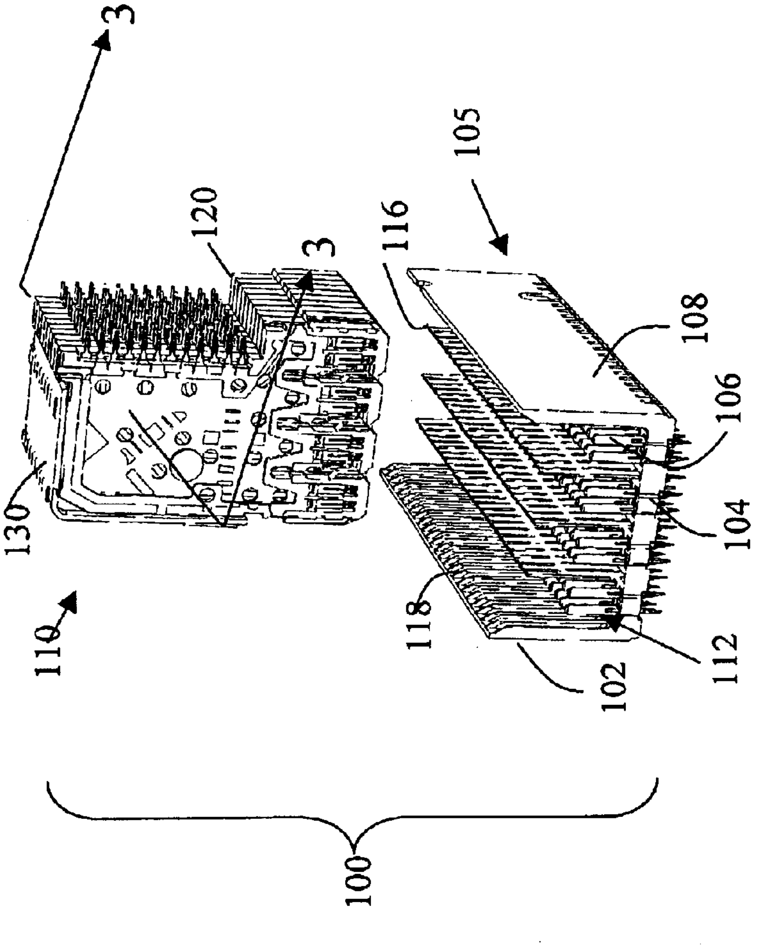
FIG. 1 is a prior art connector.

Referring to FIG. 1, a two piece electrical connector 100 is shown to include a backplane connector 105 and a daughtercard connector 110. These connectors are configured to be connected to a backplane and a daughtercard printed circuit board. The printed circuit boards are not shown. Also, it should be appreciated that these connectors might not be used solely to interconnect printed circuit boards. Often, connectors are mounted to cables and the cables are connected to printed circuit boards by mating the cable connectors with connectors attached to printed circuit boards.

The backplane connector 105 includes a backplane shroud 102 and a plurality of signal contacts 112, here arranged in an array of differential signal pairs. In the illustrated embodiment, the signal contacts are grouped in pairs, such as might be suitable for manufacturing a differential signal electrical connector. A single-ended configuration of the signal contacts 112 is also contemplated in which the signal conductors are evenly spaced. In the prior art embodiment illustrated, the backplane shroud 102 is molded from a dielectric material such as a liquid crystal polymer (LCP), a polyphenyline sulfide (PPS) or a high temperature nylon. All of these are suitable for use as binder materials in manufacturing connectors according to the invention.

The signal contacts 112 extend through a floor 104 of the backplane shroud 102 providing a contact area both above and below the floor 104 of the shroud 102. Here, the contact area of the signal contacts 112 above the shroud floor 104 are adapted to mate to signal contacts in daugthercard connector 110. In the illustrated embodiment, the mating contact area is in the form of a blade contact.

A tail portion of the signal contact 112 extends below the shroud floor 104 and is adapted for mating to a printed circuit board. Here, the tail portion is in the form of a press fit, "eye of the needle" compliant contact. However, other configurations are also suitable, such as surface mount elements, spring contacts, solderable pins, solderable leads, etc. In a typical configuration, the backplane connector 105 mates with the daughtercard connector 110 at the blade contacts 106 and connects with signal traces in a backplane (not shown) through the tail portions which are pressed into plated through holes in the backplane.

The backplane shroud 102 further includes side walls 108 which extend along the length of opposing sides of the backplane shroud 102. The side walls 108 include grooves 118 which run vertically along an inner surface of the side walls 108. Grooves 118 serve to guide the daughter card connector 110 into the appropriate position in shroud 102. Running parallel with the side walls 108 are a plurality of shield plates 116, located here between rows of pairs of signal contacts 112. In a presently preferred single ended configuration, the plurality of shield plates 116 would be located between rows of signal contacts 112. However, other shielding configurations could be formed, including having the shield plates 116 running between the walls of the shrouds, transverse to the direction illustrated. In the prior art, the shield plates are stamped from a sheet of metal.

Each shield plate 116 includes one or more tail portions, which extend through the shroud base 104. As with the tails of the signal contacts, the illustrated embodiment has tail portions formed as an "eye of the needle" compliant contact which is press fit into the backplane. However, other configurations are also suitable, such as surface mount elements, spring contacts, solderable pins, solderable leads, etc.

The daughtercard connector 110 is shown to include a plurality of modules or wafers 120 that are supported by a stiffener 130. Each wafer 120 includes features which are inserted into apertures (not numbered) in the stiffener to locate each wafer 120 with respect to another and further to prevent rotation of the wafer 120.

Figure 2:
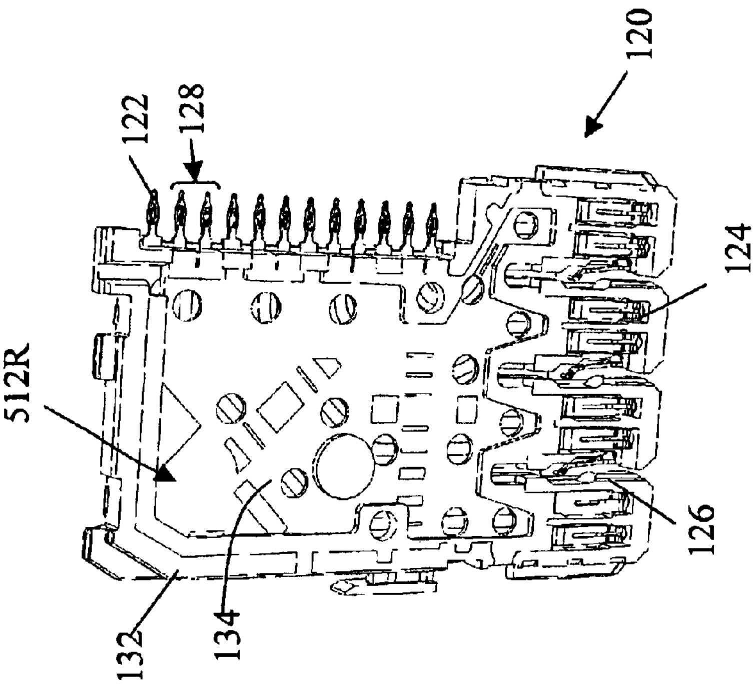
FIG. 2 is a wafer used in the construction of the connector in FIG. 1.

Referring now to FIG. 2, a single wafer is shown to give an example of how the connector of FIG. 1 might be manufactured. Wafer 120 is shown to include dielectric housings 132, 134 which are formed around both a daughtercard shield plate (10, FIG. 3) and a signal lead frame. As described in the above-mentioned U.S. Pat. No. 6,409,543, wafer 120 is preferably formed by first molding dielectric housing 132 around the shield plate, leaving a cavity. The signal lead frame is then inserted into the cavity and dielectric housing 134 is then overmolded on the assembly to fill the cavity.

As hereinafter described, absorptive material might be built into the connector. One way to incorporate absorptive material into the connector might be to place the absorptive material into the cavity and then secure it in place with dielectric housing 134.

Extending from a first edge of each wafer 120 are a plurality of signal contact tails 128, which extend from the signal lead frame, and a plurality of shield contact tails 122, which extend from a first edge of the shield plate. In the example of a board to board connector, these contact tails connect the signal conductors and the shield plate to a printed circuit board. In the preferred embodiment, the plurality of contact tails 122 and 128 on each wafer 120 are arranged in a single plane.

Here, both the signal contact tails 128 and the shield contact tails 122 are in the form of press fit "eye of the needle" compliants which are pressed into plated through holes located in a printed circuit board (not shown). In the preferred embodiment, it is intended that the signal contact tails 128 connect to signal traces on the printed circuit board and the shield contact tails connect to a ground plane in the printed circuit board. In the illustrated embodiment, the signal contact tails 128 are configured to provide a differential signal and, to that end, are arranged in pairs.

Near a second edge of each wafer 120 are mating contact regions 124 of the signal contacts which mate with the signal contacts 112 of the backplane connector 105. Here, the mating contact regions 124 are provided in the form of dual beams to mate with the blade contact end of the backplane signal contacts 112. The mating contact regions are positioned within openings in dielectric housing 132 to protect the contacts. Openings in the mating face of the wafer allow the signal contacts 112 to also enter those openings to allow mating of the daughter card and backplane signal contacts.

Provided between the pairs of dual beam contacts 124 and also near the second edge of the wafer are shield beam contacts 126. Shield beam contacts are connected to daughter card shield plate 10 (FIG. 3A) and are preferably formed from the same sheet of metal used to from the shield plate. Shield beam contacts 126 engage an upper edge of the backplane shield plate 116 when the daughter card connector 110 and backplane connector 105 are mated. In an alternate embodiment (not shown), the beam contact is provided on the backplane shield plate 116 and a blade is provided on the daughtercard shield plate between the pairs of dual beam contacts 124. Thus, the specific shape of the shield contact is not critical to the invention.

Figure 3A:
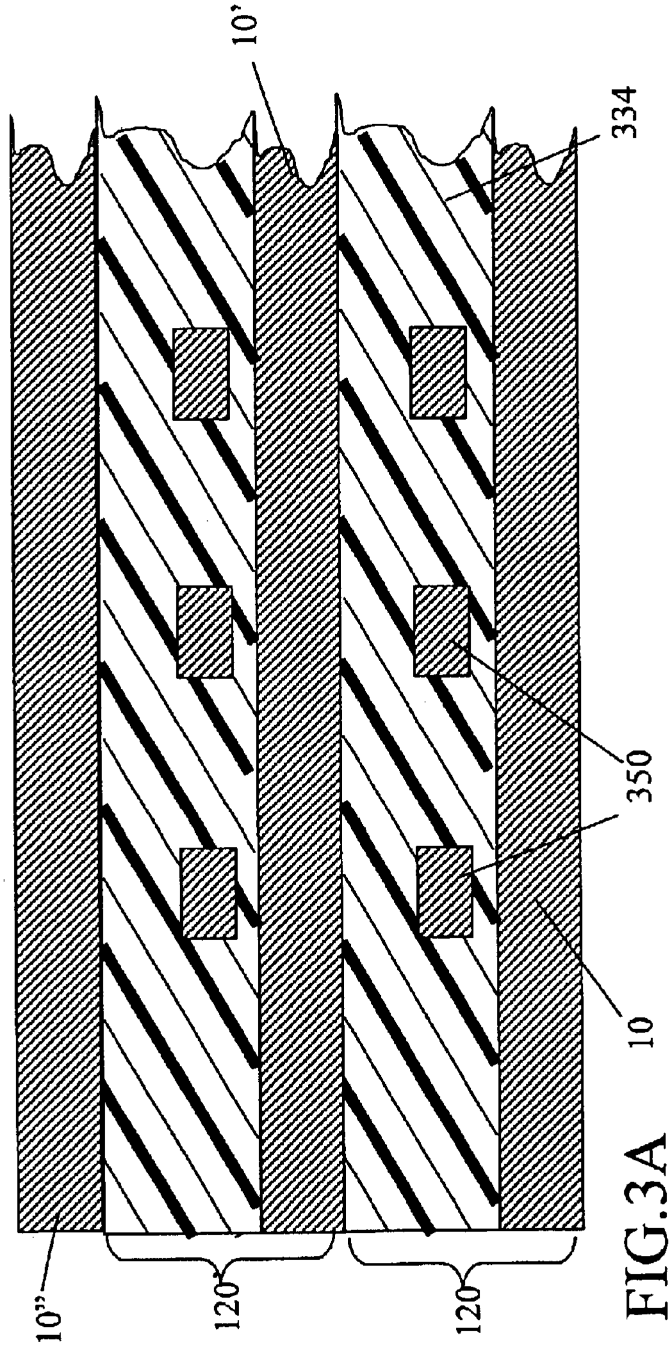
FIG. 3A is a cross sectional view of the connector of FIG. 1.

FIG. 3A shows a portion of daughter card connector 110 in cross section. For simplicity, only a portion of two wafers 120 are shown. Also, the insulative housings are shown as a single, element 334. In this cross section, intermediate portions 350 of the signal conductors are shown embedded in the housing 334. For the present invention, the order of the manufacturing steps is not important. For example, the insulative housing could be formed around the signal conductors and then a shield member might be attached to the housing.

It will be appreciated that signal conductors are elongated elements needed to carry signals from one point to another. They are elongated in the direction perpendicular to the plane illustrated in FIG. 3A. Likewise, shield 10 is elongated, running parallel to the elongated direction of the signal contacts. Preferably, shield 10 will run parallel to the signal conductors over substantially all of their length.

Figure 3B:
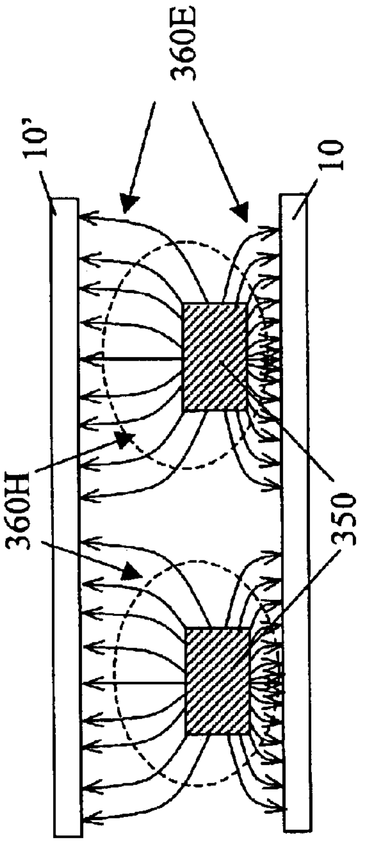
FIG. 3B is a sketch illustrating the electromagnetic field pattern for the connector of FIG. 3A.

FIG. 3B illustrates the manner in which the signal conductors are effective at carrying electronic signals. In the illustrated configuration, the connector carries single ended signals—signals in which a signal is represented by the electrical potential between the signal conductor and some reference potential, or "ground." Here, the shield 10 acts as ground.

For high frequency signals, very little of the signal's energy travels within the conductor. Rather, it is the result of electromagnetic radiation being directed by the signal conductors or the signal conductors and associated ground conductors. FIG. 3B illustrates the electric field lines 360E and magnetic field lines 360H associated with signals on the signal conductors 350. As is conventional in the art, a closer spacing between the field lines 360 indicates an increased strength of the electric field.

In FIG. 3B, the signal conductors 350 and shield plate 10 associated with the wafer 120 carrying the signal conductors form a structure resembling a "microstrip transmission line." In particular, the signal conductors 350 in wafer 120 are closer to shield plate 10 of wafer 120 than they are to either any adjacent signal conductor or to the shield plate 10' of an adjacent wafer 120'. This positioning of conductive members results in a stronger field in the region between each conductor 350 and its dominant ground conductor. However, it can be seen that there are other electric and magnetic fields caused by a signal propagating on one of the conductors 350.

Also, there are many weaker electric and magnetic fields that are not specifically shown in FIG. 3B. There will be some fields between adjacent conductors, which causes cross talk. To a lesser extent, a signal on any of the conductors 350 will also create fields that radiate into other parts of the connector. For example, it is possible that a signal on a conductor 350 on a wafer 120 will radiate signals that reach into another wafer, such as the adjacent wafer 120'.

Generally, it has been accepted that radiation from one wafer to another is relatively small in comparison to the radiation from one conductor to another within the same wafer. It was believed that the shields 10, 10', 10", etc. were adequate to contain the radiation between columns of signal conductors such that any radiation that made it past the shields would have an insignificant impact on performance. However, we have discovered that these assumptions are not always true, particularly when signals have frequencies in excess of 1 GHz and particularly when the frequencies exceed 3 GHz.

We theorize that the regions between shields, such as for example the volume between shields 10' and 10" has one or more particular resonant frequencies associated with it. When a structure is excited at its resonant frequency, even a small stimulus can create a relatively large signal. Thus, more crosstalk than heretofore realized is caused between one wafer and another because the shielding creates "cavities" that are excited by relatively small signals. However, the problem is not limited to excitation from one wafer to another. A signal conductor might excite a "cavity" formed by its associated shield, thereby creating greater crosstalk with other signal conductors in the same wafer.

A further undesired effect of exciting a "cavity" at its resonance frequency is that there would likely be an increase in electromagnetic radiation to the outside of the electronic system.

We also theorize that the converse situation can also interfere with the performance of very high frequency interconnection systems. Stray radiation from outside the system might excite the cavity. The resonance might then create noise within the connector.

We believe that performance of modem interconnection systems is being impacted to a much greater extent than heretofore realized because the shielding, frequency of operation and dimensions of current interconnection systems are such that the shielding forms cavities that are excited by signal frequencies above 1 GHz and particularly above 3 GHz. Having recognized this problem and understood its cause, we have developed a solution.

By selective use of electromagnetic absorptive material in the interconnection system, we can greatly reduce the crosstalk and improve the overall performance of the interconnection system. Traditionally, one would avoid the use of absorptive material in an interconnection system because it is generally contrary to the desired objective of transmitting as much signal as possible. However, our invention involves the placement of absorptive material in locations where the impact on the unintended or stray electromagnetic fields is greater than on the electromagnetic fields needed to propagate the desired signals. Or more generally, our invention involves the placement of absorptive material to preferentially absorb undesired modes within the connector.

The absorptive material, we theorize, has three functions, some or all of which might be achieved depending on the placement of the absorptive material. First, the absorptive material absorbs energy associated with stray radiation. Thus, less stray, radiation is available to create unwanted excitations or otherwise create noise in the system. Second, it reduces the "Q" of the resonant structures. The "Q" of a structure, sometimes called the quality factor, is the ratio between the amount of energy stored to the amount of energy dissipated in a cycle. Third, it changes the resonant frequency of cavities so that they are not excited at the frequencies of the desirable signals being carried by the interconnection system.

Figure 3C:
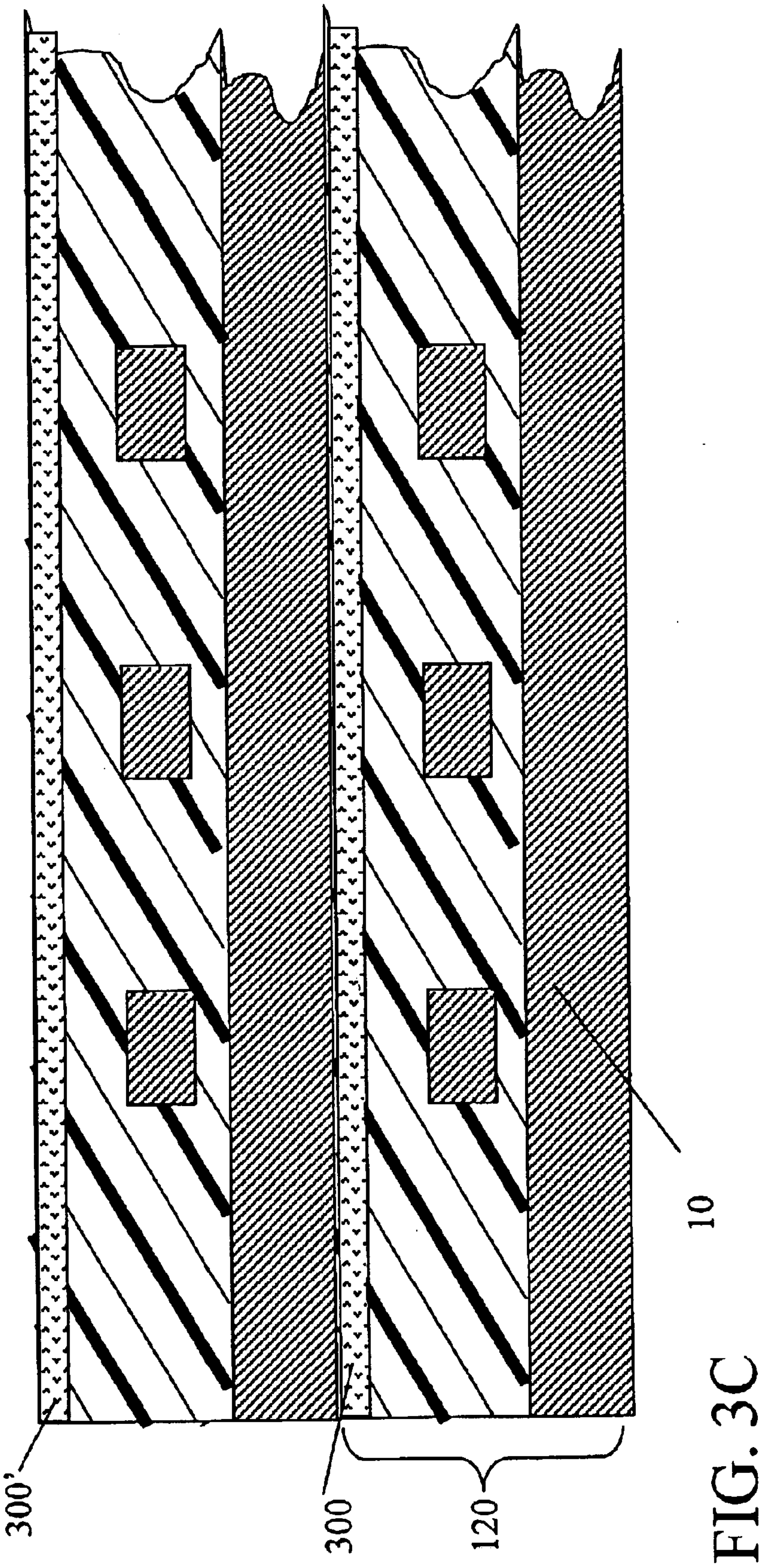
FIG. 3C is a cross sectional view of the connector of FIG. 3A modified for high frequency operation.

Turning now to FIG. 3C, an example of the placement of the absorptive material is shown. A layer of absorptive material 300 is shown on each wafer. Note from FIG. 3B that the signal conductors in each wafer are primarily coupled to one of the shield members. The lossy material 300 is positioned so as not to interfere with the primary coupling of desired signals.

There are many suitable materials to form the absorptive materials. Three classes of materials that might be used are magnetically lossy materials, lossy dielectric materials and lossy conductive materials. Ferrites are common magnetically lossy materials. An example of a suitable ferrite material that might be purchased commercially is that material sold by Emerson & Cuming under the trade name Eccosorb®. Materials such magnesium ferrite, nickel ferrite, lithium ferrite, yttrium garnet and aluminum garnet might be used.

The "magnetic loss tangent" is the ratio of the imaginary part to the real part of the complex magnetic permeability of the material. Materials with higher loss tangents might also be used. Ferrites will generally have a loss tangent above 0.1 at the frequency range of interest. Presently preferred ferrite materials have a loss tangent between approximately 0.1 and 1.0 over the frequency range of 1 Ghz to 3 GHz and more preferably a magnetic loss tangent above 0.5.

Lossy dielectric materials are any materials that are not generally thought of as conductors that have an electric loss tangent greater than approximately 0.01 in the frequency range of interest. The "electric loss tangent" is the ratio of the imaginary part to the real part of the complex electrical permitivity of the material. Materials that are presently preferred have an electric loss tangent that is between approximately 0.04 to 0.2 over a frequency range of 1 GHz to 3 GHz. It is possible that a material might simultaneously be a lossy dielectric and a magnetically lossy material.

Lossy conductive materials are materials that conduct, but are relatively poor conductors. The materials used preferably have a surface resistivity between 1 Ω/square and $10^6$ Ω/square. More preferably, these materials will have a surface resistivity between 10 Ω/square and $10^4$ Ω/square.

Examples of lossy materials are carbon impregnated materials. For example, material containing carbon fiber might be used. Or materials that are impregnated with fine metal powder or conducting metal fibers. These filler materials receive the radiation, but dissipate it without reflecting it. When metal powder or fiber is used to impregnate some binder, it is preferable that the density of the metal in the binder be low enough that the metal particles do not form large conductive structures by touching. In this configuration, the metal particles will receive the radiation which will be dissipated due to the skin effect in the particles or fiber. When metal fiber is used, preferably, the fiber will be present in about 3% to 7% by volume.

Absorptive material 300 will have a thickness that depends on many factors, and will likely represent a compromise of many factors driven by a specific application, some of which are unrelated to the desired level of absorption. However, a typical thickness for material 300 is 0.01" (0.25 mm) to 0.08: (2 mm).

There are many ways in which absorptive material might be introduced into the interconnection system. One way is to mix the material with a binder, such as epoxy. The material could be spread in place and then the binder might be cured. Alternatively, the material might be mixed with a solvent that was then volatized, leaving a coating of the absorptive material.

An alternative approach might be to mix the absorptive material with a thermoplastic binder of the type used to mold traditional connectors. The housing portion of the connector might be molded in two steps, with one molding step using the binder that has been filled with absorptive material. A molding process for making connectors with metal filled portions is described in a patent application entitled Electrical Connector with Conductive Plastic Features, filed in the name of Cohen, et al. on the same date as the present application.

FIG. 3C shows that the absorptive material is placed adjacent a shield member 10. In a preferred embodiment, the absorptive material will be placed adjacent to and preferably contiguous with a shield member. More preferably, it will be placed on the side of a shield opposite the signal connector coupled to that shield.

FIG. 3C shows a side view of a layer of absorptive material. It is not necessary that the absorptive material be coextensive with the shield. The absorptive material might be divided into regions of differing length and width to tailor the relative absorption of the desired radiation to undesired radiation.

Figure 4A:
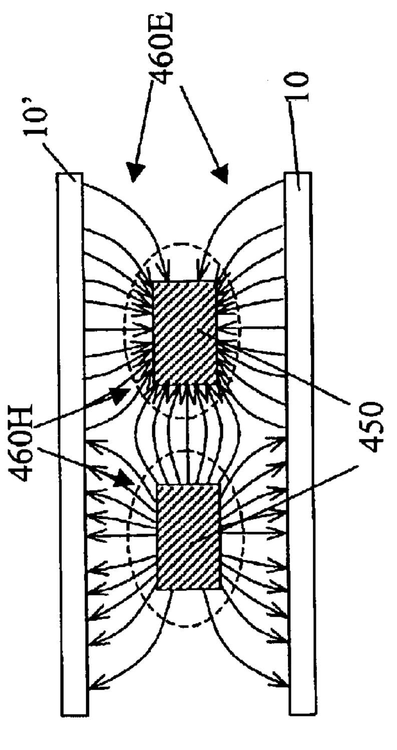
FIG. 4A is a sketch illustrating the electromagnetic field pattern for a connector carrying differential signals.

FIG. 4 shows an alternative connector configuration that uses absorptive material to improve high frequency performance. The connector in FIG. 4A represents a differential connector. As shown in FIG. 4A, the signal conductors 450 are organized in pairs, with the conductors in the pairs positioned closer together than the spacing between conductors in adjacent pairs. This positioning gives preferential coupling of electric fields between the signal conductors within a pair. However, there is also some coupling between the signal conductors and the nearby ground planes formed by the shield members 10, 10', etc.

In this configuration, absorptive material 400 is placed between pairs of differential signal conductors. Absorptive material placed between pairs will reduce unwanted signals to a much greater extent than it reduces signals transmitted by the differential pair.

Likewise, absorptive material 402 is placed to preferentially absorb undesired signals. In a perfectly balanced differential signal with odd mode and no even mode, the desired field strength in the regions occupied by absorber 402 would be nearly zero, because equal and opposite fields from each conductor would substantially cancel out in those regions. However, in a practical system, there will never be perfect cancellation and there will therefore be some unwanted electromagnetic fields in that region associated with undesired even mode propagation. Absorptive material 402 is placed to primarily absorb unwanted even mode components of the propagating signal.

Figure 4B:
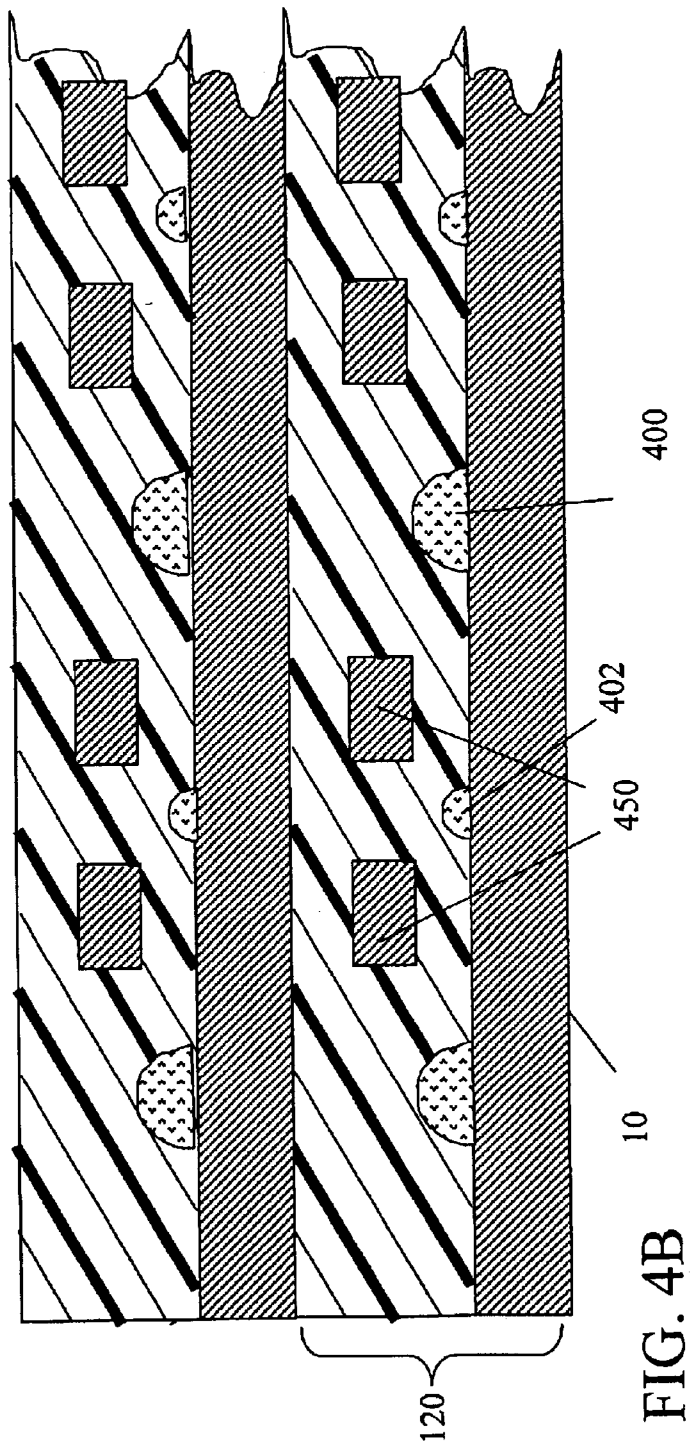
FIG. 4B is a cross sectional view of the connector of FIG. 4A modified for high frequency operation.

FIG. 4B shows absorptive material on only one side of each wafer 120. It should be appreciated that when the wafers are generally symmetrical, the electric fields on each side of the wafer will be generally the same and absorptive material could be placed on both sides of the wafer in a mirror image configuration. Also, it is not necessary that the absorptive material be disposed along the entire length of the signal conductors. The length and width of the strips of absorptive material can be varied to tailor the relative absorption of desired to undesired modes.

One way to achieve preferential absorption of unwanted signals is to place a lossy magnetic material, such as a ferrite, in a region where a particular unwanted mode is a magnetic antinode—or a region of locally maximum current or magnetic field intensity. Where a lossy dielectric material is used, the material might be positioned near an electric antinode—or a region of locally maximum charge or electric field intensity. If a lossy conductive material is used, it might also be positioned near an electric antinode.

Figure 5B:
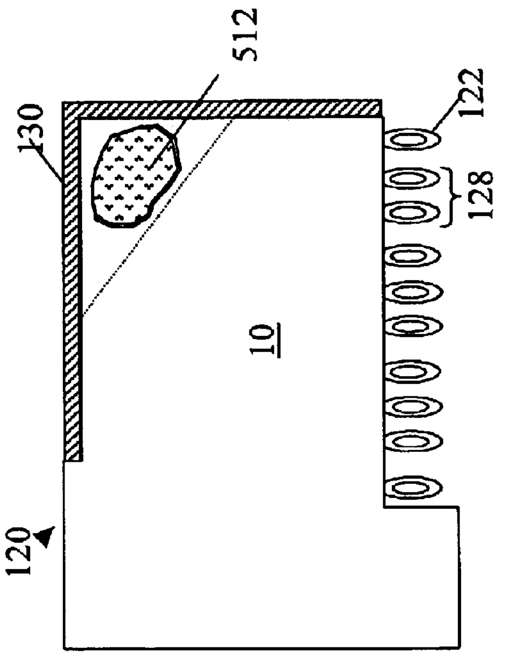
FIGS. 5A and 5B are cross sectional views of alternative embodiments of the connector of FIG. 1 modified for high frequency operation.
Figure 5A:
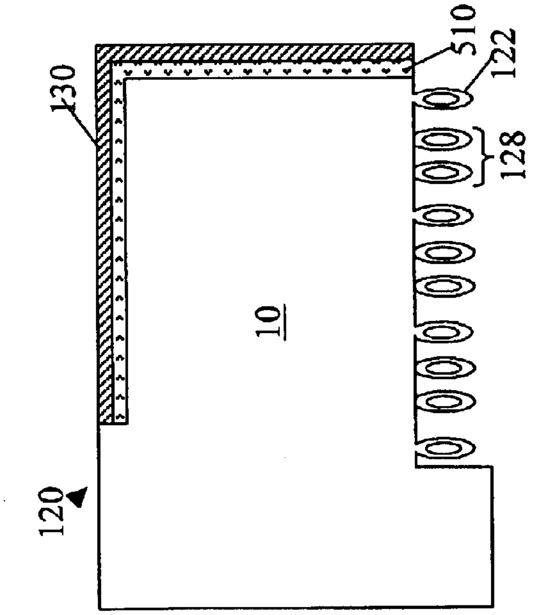

FIG. 5A and FIG. 5B show alternative placements of absorptive material. FIG. 5A represents a side view of daughter card connector such as connector 110 (FIG. 1). The side of a wafer 120 is visible in this view. Here, the side of the wafer covered by shield member 10 is visible. The stiffener 130 is visible in cross section. In the illustrated embodiment, stiffener 130 is illustrated as metal. However, the construction of stiffener 130 is not important to the invention and conductive or non-conductive materials could be used.

Here a layer of absorptive material 510 is positioned between stiffener 130 and each of the shields 10. We believe that absorptive material 510 greatly reduces the radiation that propagates between the signal conductors of one wafer and the cavity created by the shield plates of an adjacent wafer. Absorptive material 510 also has a damping effect on the cavities formed by the shield plates bordering each of the wafers, thereby reducing the impact of resonance in the cavities. Absorptive material in this configuration will also reduce unwanted radiation from the connector.

Absorptive material 510 could be provided by a coating on stiffener 130. Alternatively, it could be provided as a separate sheet of material that is simply inserted between the stiffener and the wafers. Preferably, absorptive material 510 is a ferroelectric material. Though, it should be appreciated that an absorptive layer on stiffener 130 could equally well be formed by making all or part of the body of stiffener 130 from an absorptive material.

FIG. 5B shows an alternative placement of absorptive material. Absorptive material 512 is, in this embodiment, provided as a portion of the housing of wafer 120. As can best be seen in FIG. 2, there is a region 512R of each wafer 120. This region might be formed of an absorptive material. In the preferred embodiment, the absorptive material 512 is therefore positioned under the shield 10 (shown partially cut away in FIG. 5B) of the wafer 120. When wafers are stacked side-by-side to create a connector, the absorptive material 512 is then positioned between shields of adjacent wafers.

Figure 6:
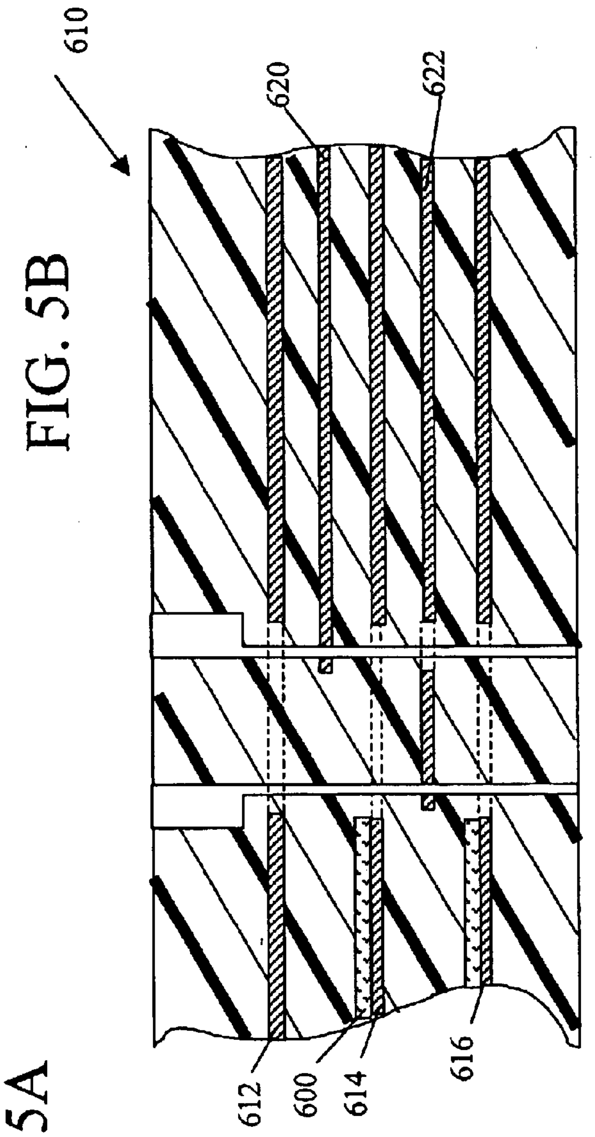
FIG. 6 is a cross sectional view of a printed circuit board modified for high frequency operation.

FIG. 6 shows yet another embodiment of the invention. FIG. 6 shows a cross sectional view of a printed circuit board 610. Ground planes, such as ground planes 612, 614 and 616 act similarly to the shields described in the connectors. They provide shielding between traces in different layers of the printed circuit board as well as form a microstrip transmission line with the traces on a particular layer. They can also form a "cavity" that might resonate if excited by signals at a particular frequency.

As with the connectors described above, absorptive material 600 is preferably positioned where its absorption will have a greater impact on unwanted electromagnetic energy than on the electromagnetic energy needed to propagate desired signal modes. In FIG. 6, the electromagnetic energy associated with each signal trace is concentrated between the signal trace and the nearest ground planes for signal ended signals. For differential signals carried on an adjacent pair of traces, the electromagnetic energy is concentrated between the traces in a similar pattern to FIG. 4A. For example, the radiation around trace 620 is concentrated between the trace and ground planes 612 and 614. Likewise, the radiation around trace 622 is concentrated between the trace and ground planes 614 and 616. Thus, absorptive material 600 is not positioned in that area. However, absorptive material 600 is otherwise positioned over the ground planes to absorb unwanted radiation and damp resonance.

It should be appreciated that the absorptive material need not fully cover the ground planes in a printed circuit board. It could be deposited in strips that run parallel to the signal paths, as shown in FIG. 4B. Or, the absorptive material might be positioned in regions away from the signal conductors where it absorbs undesired modes of radiation or changes the Q of resonant "cavities." It might be positioned around the periphery of a printed circuit board, in a configuration analogous to what is shown in FIG. 5A or 5B.

Any convenient method of building an absorptive layer into a board could be used. Absorptive material might be mixed with an epoxy binder compatible with the material used to form the matrix of the printed circuit board. It could be formed in sheets and partially cured, much like a prepreg of a printed circuit board. It might then be patterned using photoresists and photolithographic techniques. Alternatively, it might be applied as a coating to conventional prepreg materials.

Figure 7:
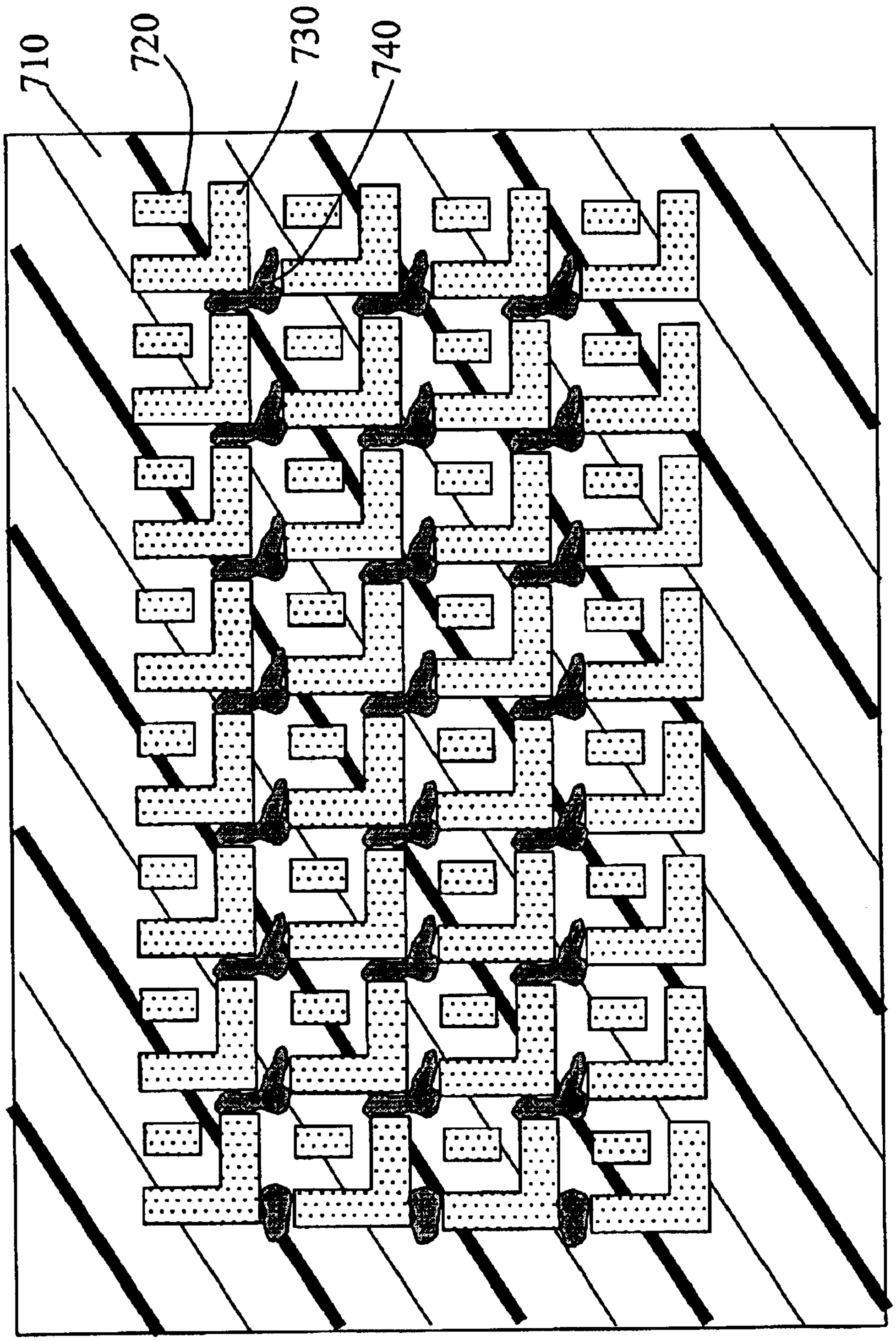
FIG. 7 is a cross sectional view of an electrical connector according to the invention; and FIG, 8 is a cross sectional view of a further embodiment of an electrical connector according to the invnetion.

FIG. 7 shows an alternative embodiment. FIG. 7 represents a cross sectional view of an interconnection system, such as the mating portion of a connector such as daughter card connector 110. The interconnection system of FIG. 7 has an array of signal conductors 720. Here a two dimensional array is shown, though the same principles would apply to a one-dimensional array.

There are numerous ground conductors 730 in the array. FIG. 7 is an example of what we call a "multiground interconnect structure."

In the illustrated embodiment, the ground conductors surround the signal conductors on a plurality of sides. Here, the ground conductors are L-shaped and surround the signal conductors on two sides. U-shaped grounds might be used and surround the signal conductors on three sides. Alternatively, box shaped or circular ground conductors might be used to fully surround each signal conductor or each pair of conducting members forming a differential pair. In the embodiment where circular grounds are used, the interconnect structure would resemble a signal cable bundle made up of co-axial cables. Thus, while the invention is illustrated with respect to a connector, which is the most useful form, it might be employed with other structures.

In a multi-ground system, we have observed that there is a high power density of undesired modes between the grounds. At these locations, there is also a low power density for the desired modes. Accordingly, the places in the multiground structure where grounds are adjacent to each other represents a desirable locating for placing absorptive material 740.

The absorptive material might be connected to one of the ground structures or might be simply disposed within the insulative housing 710 holding the array of conductors and grounds. In an electrical connector, the absorptive material might be placed within the connector housing. In a cable, the absorptive material might be places as part of the cable sheath.

Figure 8:
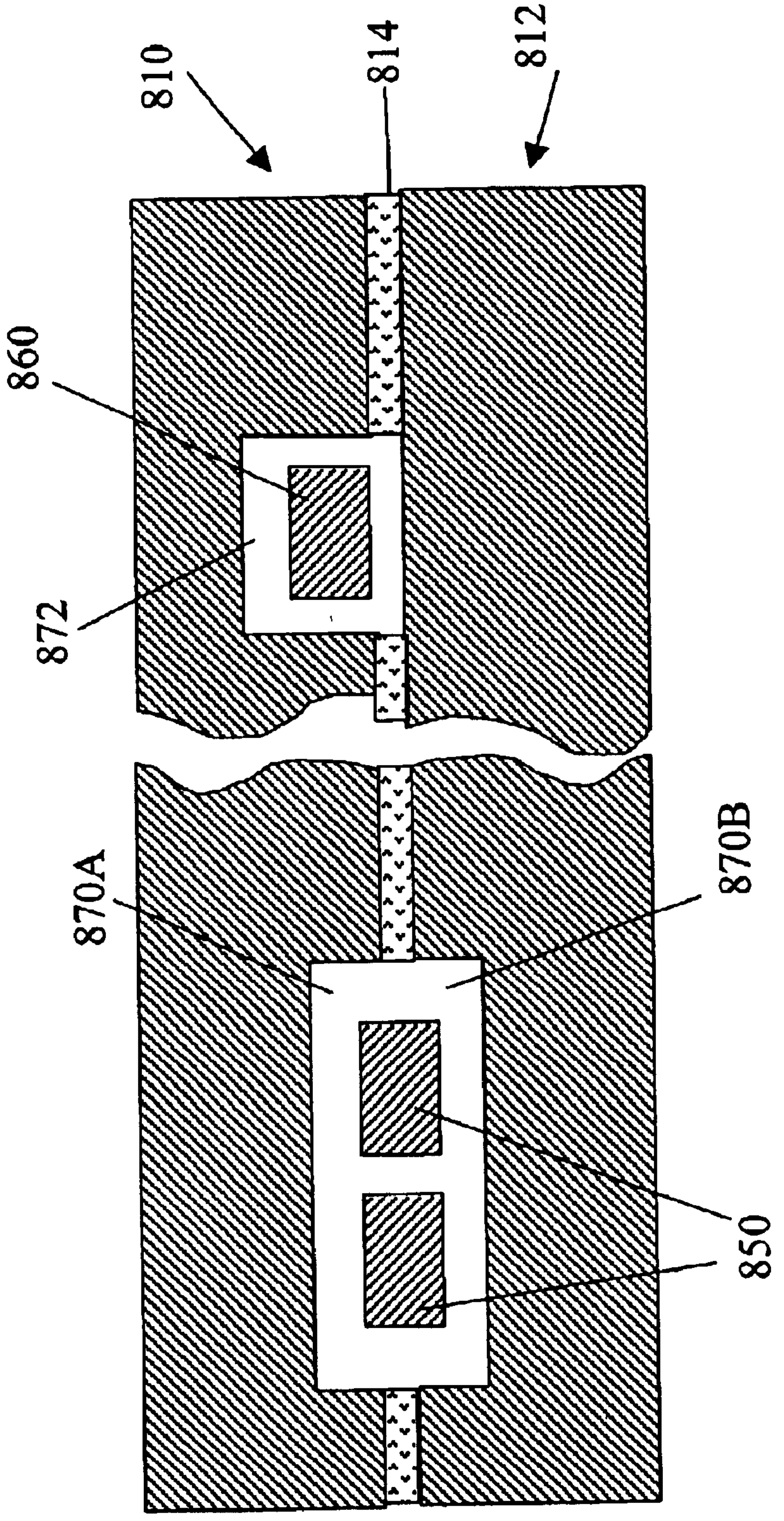

FIG. 8 is a cross sectional view of an alternative embodiment of an electrical connector according to the invention. FIG. 8 illustrates a connector such as is known in the art that has a housing made of a plurality of pieces that join to surround a plurality of signal conductors. For simplicity of illustration, the connector housing is shown to be made of two pieces, housing portion 810 and housing portion 812.

In the preferred embodiment, the housing portions are here shown to be made of metal, such as a die cast metal. However, other suitable materials include plastics or other dielectric material filled with conductive particles or fibers or coated with conductive layers. In this way, the housing can act as both a housing and a shield member.

The housing portions have channels, such as 870A, 870B and 872 formed therein. Signal conductors, such as 850 and 860 are positioned in these channels. In prior art connectors of this type, the signal conductors arc insulated from the housing by insulative spacers (not shown) at various points along their lengths. However, insulative coatings or other structures might be used to avoid direct electrical contact between the signal conductors and conducting portions of the housing.

When the connector is assembled, as shown in FIG. 8, it is desired that the conductive portions butt against each other. This is to avoid leaving space between the housing portions that could act as resonant cavities or allow the propagation of radiation from one set of signal conductors to another.

According to the invention, a layer of lossy material 814 is placed between the housing portions 810 and 812 along their interface. Lossy material 814 avoids the undesired effects of spacing between the housing portions. Lossy material might be a coating applied to either or both portions, but other convenient ways of inserting lossy material at the interface might be used.

FIG. 8 shows signal conductors 850 positioned as a pair of conductive members. Signal conductor 860 is a single conductive member. Connectors might carry either differential or single ended signals. When differential signals are carried, the signal conductors will likely be disposed as pairs, such as illustrated with signal conductors 850. Where single ended signals are used, the signal conductors will more likely have the form of conductors 860. Both single ended and differential signals are illustrated in FIG. 8. It should be appreciated that most connectors will have many signal conductors of one type or the other, but will not necessarily have both types of signals.

Also, two forms of channels are shown in FIG. 8. Channels 870A and 870B are designed to align and form a larger channel through which the signal conductors will be routed. In contrast, channel 860 is large enough to contain a signal conductor and therefore mates against a flat surface. It should be appreciated that either or both of these types of channels might be used in a connector. Moreover, channels of any convenient shape might be used.

Alternatives

Having described one embodiment, numerous alternative embodiments or variations can be made.

For example, FIG. 4B shows absorptive material partially filling the space between adjacent pairs of conductors forming a differential pair. Larger areas of absorptive material might be provided, fully occupying the space between shield plates. Or, if shield plates are not provided, the absorptive material might fully surround each differential pair.

Furthermore, many of the embodiments show absorptive material running parallel to elongated signal conductors. Such a configuration is not required. The absorptive material might be placed in any area where the power densities of unintended modes of electromagnetic radiation exceed the power densities of the electromagnetic radiation representing the desired signals. Even when absorptive material runs parallel to signal conductors, it is not necessary that the absorptive material be parallel to the signal conductors over their entire length.

As another example, it is known to die cast connector housings of conductive metal and then insulate the signal conductors from the housing with grommets, plugs or the like. A die cast housing could be made with a ferrite, thereby providing the desired lossy material.

It should also be appreciated that embodiments of single ended signals could easily be converted to carry differential signals, and vice versa.

Also, it was described above that absorptive materials are placed to preferentially absorb radiation associated with unwanted modes in the interconnection system. In many embodiments, the absorptive material is placed away from regions in which there is radiation associated with desired signal propagation. However, not all areas of preferential absorption can be so characterized. For example, in some structures, there will be some regions in which there is radiation associated with desired signal modes in addition to radiation associated with undesired modes. If the radiation associated with the undesired modes is sufficiently large, placing absorptive material in these regions can have a greater effect relative to the effect on the undesired modes, thereby providing preferential absorption. For example, it is likely that unwanted radiation will be large near the ends of signal conductors. Placing a region of absorptive material over the ends of the signal conductors might therefore preferentially absorb the unwanted modes.

The invention is illustrated in connection with a circuit board assembly that serves as an interconnection system. The circuit board assembly includes printed circuit boards or cards that are joined through electrical connectors. Cable connectors plugging into connectors mounted on a board might also serve as a portion of a circuit board assembly. A circuit board assembly represents the presently preferred embodiment, but other embodiments might also be constructed.

Furthermore, shield plates are illustrated in many embodiments as being flat. To obtain improved shielding or for other performance improvements, the shields might not be flat. For example, the plates might be shaped to create channels or other structures that surround signal conductors.

While the invention has been particularly shown and described with reference to the preferred embodiments thereof, it will be understood by those skilled in the art that various changes in form and detail may be made therein without departing from the spirit and scope of the invention.

What is claimed is:

1. A circuit board assembly having an interconnection system, wherein the interconnection system includes an electrical connector comprising:

a) a plurality of rows of conductive signal members;

b) a ground plate corresponding to each of the plurality of rows of conductive signal members; and c) absorptive material corresponding to and provided for each of the plurality of rows of conductive signal members, the absorptive material absorbing unwanted modes of electromagnetic energy in relation to the modes propagating desired signals through the interconnection system.

2. The circuit board assembly of claim 1 wherein the absorptive material comprises a lossy material.

3. The circuit board assembly of claim 2 wherein the lossy material comprises a ferrite.

4. The circuit board assembly of claim 2 wherein the lossy material has a loss tangent between 0.1 and 1 in the frequency range of 1 GHz to 3 GHz.

5. The circuit board assembly of claim 2 wherein the electrical connector has an insulative housing holding the conductive signal members and the lossy material is integrally formed with the insulative housing.

6. The circuit board assembly of claim 1 wherein the absorptive material comprises a lossy magnetic material disposed in a magnetic antinode of the unwanted modes.

7. The circuit board assembly of claim 1 wherein the absorptive material comprises a lossy dielectric material disposed in an electric antinode of the unwanted modes.

8. The circuit board assembly of claim 1 wherein the absorptive material comprises a lossy conductive material disposed in an electric antinode of the unwanted modes.

9. An interconnection system having an electrical connector, the electrical connector comprising:

a plurality of wafers;

each of the plurality of wafers having an insulative housing, a plurality of elongated signal conductors and a ground member for shielding the signal conductors; and each of the plurality of wafers also provided with an electromagnetic absorptive member, the electromagnetic absorptive members being positioned to preferentially absorb unwanted radiation.

10. The interconnection system of claim 9 wherein the signal conductors within each wafer are disposed in pairs and the electromagnetic absorptive material is disposed between adjacent pairs.

11. The interconnection system of claim 9 additionally comprising a support member to which the plurality of wafers is attached and the absorptive material is disposed between the support member and the insulative housing of the wafers attached thereto.

* * * * *